(12) United States Patent
Kawai

(10) Patent No.: US 6,818,383 B2
(45) Date of Patent: Nov. 16, 2004

(54) METHOD FOR FORMING A RESIST PATTERN AND METHOD FOR MANUFACTURING A SEMICONDUCTOR DEVICE

(75) Inventor: Kenji Kawai, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 146 days.

(21) Appl. No.: 10/191,491

(22) Filed: Jul. 10, 2002

(65) Prior Publication Data

US 2003/0138735 A1 Jul. 24, 2003

(30) Foreign Application Priority Data

Jan. 16, 2002 (JP) .......................................... 2002-007228

(51) Int. Cl.[7] .................................................. G03F 7/00
(52) U.S. Cl. ........................ 430/311; 430/313; 430/327
(58) Field of Search ................................ 430/311, 313, 430/327; 438/952

(56) References Cited

U.S. PATENT DOCUMENTS 6,287,959 B1 * 9/2001 Lyons et al. ................ 438/636

FOREIGN PATENT DOCUMENTS

| JP | 08-306605 | 11/1996 |
|----|-----------|---------|
| JP | 08-339950 | 12/1996 |
| JP | 09-055351 | 2/1997 |
| JP | 09-080755 | 3/1997 |
| JP | 10-186672 | 7/1998 |
| JP | 11-186134 | 7/1999 |
| KR | 2001-9812 | 2/2001 |
| KR | 2001-63778 | 7/2001 |

* cited by examiner

*Primary Examiner*—Kathleen Duda
(74) *Attorney, Agent, or Firm*—Burns, Doane, Swecker & Mathis, L.L.P.

(57) ABSTRACT

In a method for forming a resist pattern, the surface of a basic substance-containing underlying film is exposed to a plasma of a carbon-containing gas to modify the surface. A chemically modifying resist film is coated on the underlying film. And the chemically modifying resist is subjected to exposure and development treatments for patterning of the chemically amplifying resist.

10 Claims, 12 Drawing Sheets

METHOD FOR FORMING A RESIST PATTERN AND METHOD FOR MANUFACTURING A SEMICONDUCTOR DEVICE

BACKGROUND OF THE INVENTION

1. Field of the Invention

The present invention relates to a method for forming a resist pattern and also to a method for manufacturing a semiconductor device using the formation method. More particularly, the invention relates to a method for forming a resist pattern wherein a chemically amplifying resist is patterned accurately on an underlying film containing a basic substance and also to a method for manufacturing a semiconductor device using the formation method.

2. Background Art

FIG. 10 and FIG. 11 are, respectively, a sectional view showing a conventional method of manufacturing a semiconductor device using a chemically amplifying resist. Referring now to FIG. 10(a), a film 103 to be processed, an antireflection film 105 and a positive type of chemically amplifying resist 107 are successively formed on a semiconductor substrate 101. Next, with reference to FIG. 10(b), the semiconductor substrate 101 is irradiated with an excimer laser beam 111 via a photomask 109 of a desired pattern for exposure of the chemically amplifying resist 107 thereto. Upon the exposure, proton acid $H^+$ is generated in the chemically amplifying resist 107 at an exposed portions 107a thereof which has been irradiated with the beam. This proton acid acts as a catalyst that causes a resist resin or the like to undergo a chemical change and convert it to a substance capable of being dissolved in a liquid developer.

Next, with reference to FIG. 10(c), the exposed, chemically amplifying resist 107 is developed to permit exposed portions 107a to be dissolved and non-exposed portions 107b to be left, thereby forming a resist pattern 107c. Referring now to FIG. 11(a), an antireflection film 105 is etched by using a mask of the resist pattern 107c to form an antireflection film pattern 105b.

Thereafter, reference is made to FIG. 11(b) wherein the film 103 to be processed is etched by using a mask of the resist pattern 107c and the antireflection film pattern 105b, thereby obtaining a desired pattern 103a of the film to be processed. Subsequently, the resist pattern is removed, followed by a given process to complete a desired semiconductor device.

In such prior art techniques as set forth above, however, when the antireflection film as an underlying film of the chemically amplifying resist, contains a basic substance which is liable to supply an electron, the solubility of the resist in a liquid developer lowers by a so-called acid deactivation phenomenon wherein the proton acid ($H^+$) generated in the resist undergoes a neutralization reaction with the electron supplied from the antireflection film at the interface between the resist and the antireflection film as shown in FIG. 12.

As a result, as shown in FIG. 10(c), the resist pattern 107c takes a form of a trailed skirt at the lower portion thereof. When the film to be processed is etched by using a mask of such a resist pattern, the resultant film pattern may become thicker than that of a desired size, or may take such a step-shifted shape that its shoulder portion is slanted downwards, thus presenting the problem that the control of dimensional accuracy becomes difficult. It will be noted that the above-mentioned chemically amplifying resist has been assumed to be of the positive type (wherein an exposed portion is dissolved in a liquid developer) and that with a negative type (wherein a non-exposed portion is dissolved in a liquid developer), the resist pattern becomes thinner at the lower portion thereof, with the result that a similar problem has been experienced in that the resist pattern may be liable to fall down, or the pattern of the film to be processed may become finer.

SUMMARY OF THE INVENTION

The present invention has been made in order to solve such problems as discussed above and a first object of the invention is to provide a method for forming a resist pattern which ensures the formation of an accurate resist pattern even on an underlying film containing a basic substance.

A second object of the invention is to provide a method for manufacturing a semiconductor device using the above resist pattern-forming method.

According to one aspect of the present invention, in a method for forming a resist pattern, a surface of an underlying film containing a basic substance is treated by exposure to a plasma using a carbon-containing gas. A chemically amplifying resist is formed on the surface-treated underlying film. The chemically amplifying resist is subjected to exposure and development treatments thereby patterning said chemically amplifying resist.

According to another aspect of the present invention, in a method for forming a resist pattern, a surface of an underlying film containing a basic substance is treated by exposing to an ozone gas. A chemically amplifying resist film is formed on the thus surface-treated underlying film. The chemically amplifying resist is subjected to exposure and development treatments thereby patterning said chemically amplifying resist.

According to another aspect of the present invention, in a method for forming a resist pattern, a surface of an underlying film containing a basic substance is treated by exposing to an oxygen-containing high temperature gas. A chemically amplifying resist film is formed on the thus surface-treated underlying film. The chemically amplifying resist is subjected to exposure and development treatments thereby patterning said chemically amplifying resist.

According to another aspect of the present invention, in a method for forming a resist pattern, an underlying film containing a basic substance is formed on a substance. A chemically amplifying resist film is formed on the underlying film. The chemically amplifying resist is subjected exposure and development treatments thereby patterning the chemically amplifying resist. The exposure is performed in such a state that the substrate is applied with a potential by voltage application means thereby causing the underlying film to be polarized.

Other and further objects, features and advantages of the invention will appear more fully from the following description.

DETAILED DESCRIPTION OF THE PREFERRED EMBODIMENTS

First Embodiment

Figure 1:
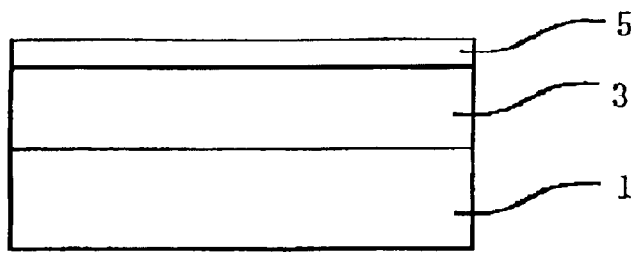
FIG. 1 is a schematic sectional view showing the manufacturing steps of a semiconductor device according to a first embodiment of the invention.
Figure 1:
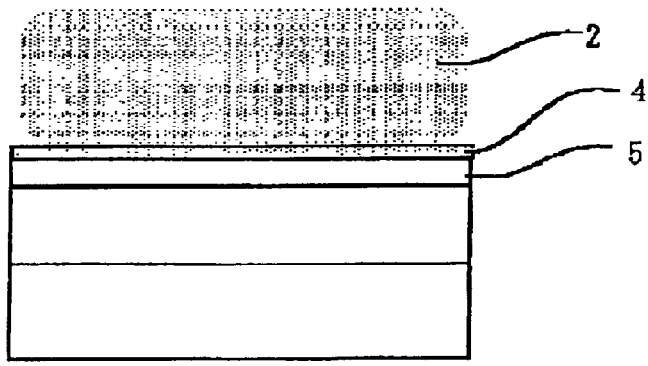
Figure 1:
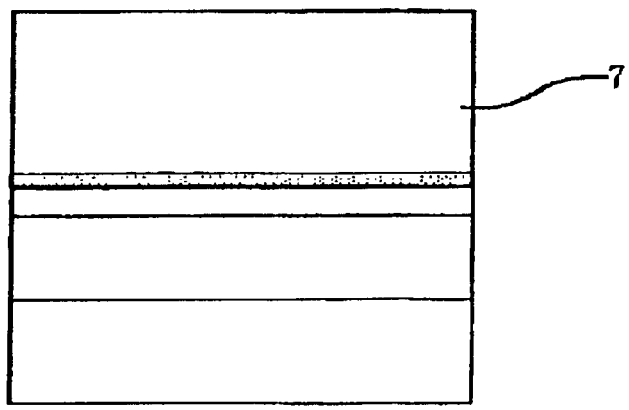
Figure 2:
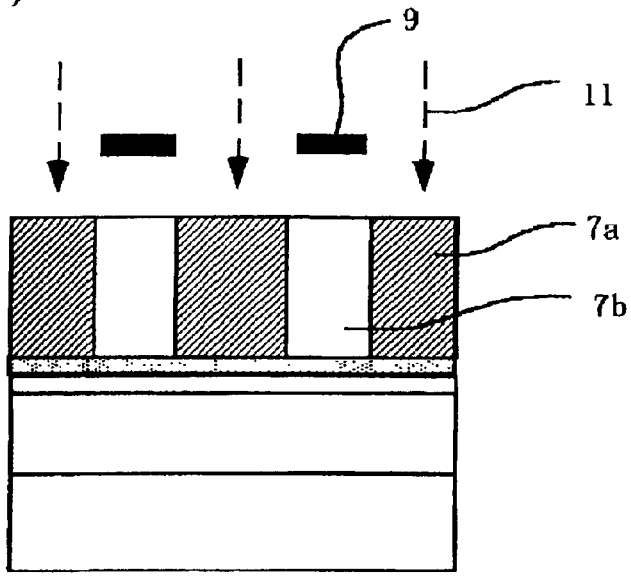
FIG. 2 is a schematic sectional view showing the manufacturing steps of a semiconductor device according to a first embodiment of the invention.
Figure 2:
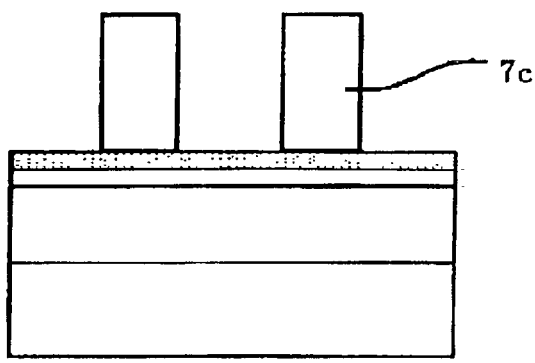
Figure 2:
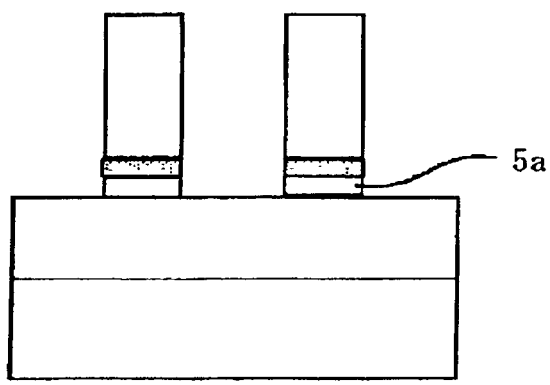
Figure 3:
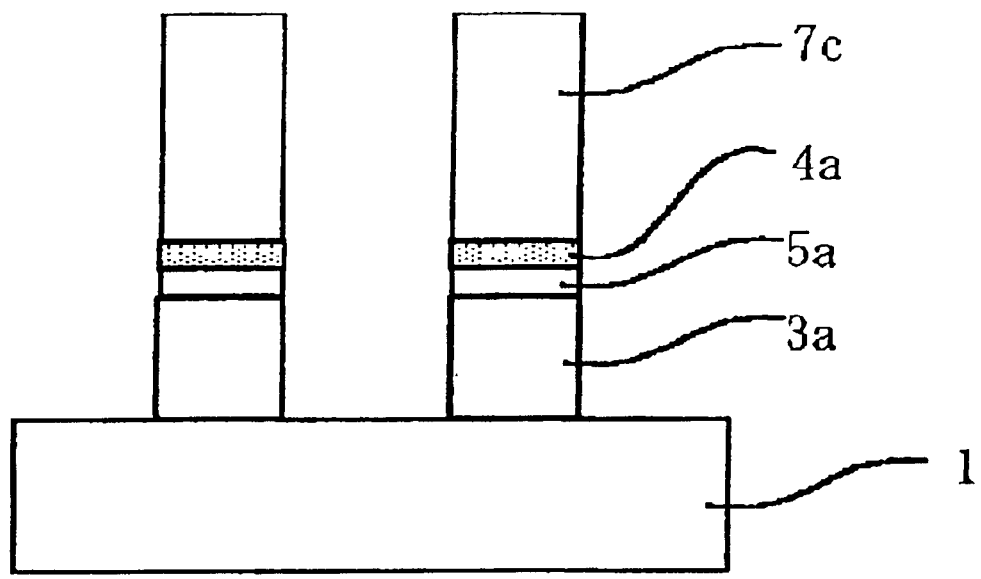
FIG. 3 is a schematic sectional view showing the manufacturing steps of a semiconductor device according to a first embodiment of the invention.

FIG. 1 to FIG. 3 are, respectively, a schematic sectional views showing the manufacturing steps of a semiconductor device according to a first embodiment of the invention. It will be noted that the same and corresponding portions are represented by the same reference numerals or marks in the following explanation, and are not repeatedly illustrated after having once set out.

Reference is now made to FIG. 1(a), wherein a film 3 to be processed, which is made of polysilicon, is formed on a semiconductor substrate 1 by a low pressure CVD method using a mixed gas of $SiH_4$ (silane) and $H_2$ (hydrogen) or a mixed gas of $SiH_4$ and $N_2$ (nitrogen) under formation temperature conditions of 600 to 700° C. At this stage, $PH_3$ or $AsH_3$ may be used as an impurity source so as to permit the impurity to be diffused by thermal treatment. Next, an antireflection film 5 made of a material exhibiting basicity, e.g. SiON (silicon oxynitride) containing N, is formed on the film 3 to be processed by a plasma CVD method using a mixed gas of $SiH_4$, $NH_3$ (ammonia) and $N_2O$ (dinitrogen oxide) under formation temperature conditions of 300° C. to 450° C.

As the antireflection film 5 exhibiting basicity, SiN (silicon nitride), TiN (titanium nitride) or the like may be used aside from the above-mentioned SiON. SiN may be formed by a plasma CVD method using a mixed gas of $SiH_4$, $NH_3$ and $H_2$ under formation temperature conditions of 300° C. to 450° C.

Next, with reference to FIG. 1(b), a gas containing C (carbon) is converted to a plasma, and the semiconductor substrate 1 is exposed to the plasma 2 to modify the surface of the antireflection film 5. The plasma 2 is formed by discharging the C-containing gas at a pressure of 1.33 Pa to 133 Pa by using of an ICP-type plasma reactor or a two frequency parallel plate type plasma reactor. The time of exposure to the plasma 2 ranges approximately 5 seconds to 30 seconds. Through the surface treatment, a 1 to 20 nm thick modified layer 4 made of a CF-based polymer ($C_xF_y$) is formed on the surface of the antireflection film 5.

Examples of the C-containing gases include gases containing at least one of fluorocarbon gases, hydrofluorocarbon gases, hydrocarbon gases, HMDS (hexamethyldisilazane: $((CH_3)_3Si)_2NH)$, CO (carbon oxide), $CO_2$ (carbon dioxide), and R—OH (alcohols) [wherein R=alkyl group].

The fluorocarbon gases include $CF_4$ (tetrafluoromethane), $C_4F_8$ (octafluorocyclobutane), $C_5F_8$ (octafluorocyclopentene), $C_4F_6$ (hexafluoro-1,3-butadiene), $C_2F_6$ (hexafluoroethane), $C_3F_8$ (octafluoropropane), and the like. The hydrofluorocarbon gases include $CHF_3$ (trifluoromethane), $CH_2F_2$ (difluoromethane), $CH_3F$ (monofluoromethane), and the like. The hydrocarbon gases include $CH_4$ (methane), $C_2H_2$ (acetylene), $C_2H_4$ (ethylene), and the like.

Next, referring to FIG. 1(c), a 500 nm thick chemically amplifying resist film 7 is formed on the antireflection film 5 having the modified layer 4 formed on the surface thereof. The chemically amplifying resist film 7 used is a commercially available positive type resist (TDUR-P015 made by Tokyo Ohka Kogyo Co., Ltd.). Subsequently, with reference to FIG. 2(a), the chemically amplifying resist 7 on the semiconductor substrate 1 is exposed by irradiating an excimer laser beam 11 such as of KrF (wavelength: 248 nm) or ArF (wavelength: 193 nm) via a photomask 9 having a desired pattern.

Upon the exposure, although a proton acid ($H^+$) as a catalyst for promoting a chemical change is generated in exposed portions 7a of the resist, the modified layer 4 formed on the surface of the antireflection film 5 used as an underlying layer acts as a block layer for blocking the feed of electrons from the antireflection film 5, thereby holding neutralization reaction (acid deactivating phenomenon) at the interface between the resist and the antireflection film.

As a result, with reference to FIG. 2(b), the solubility of the exposed portions 7a in a liquid developer increases in a subsequent development treatment, so that a resist pattern 7c formed by leaving non-exposed portions 7b takes a trailed skirt-free, good configuration. And the above surface treatment brings the hydrophobic property to the surface of the antireflection film and the improvement to the adhesion between the resist and the antireflection film.

Next, with reference to FIG. 2(c), the modified layer 4 and the antireflection film 5 are etched through the resist pattern 7c by using a plasma of a mixed gas of $CF_4$, $O_2$ and Ar controlled in a pressure of 10 mTorr to 800 mTorr by the two-frequency parallel plate type etching device to form an antireflection film pattern 5a. It will be noted that a $CHF_3$ gas may be further added to the above-mentioned mixed gas.

Further, referring to FIG. 3, the film 3 to be processed is etched through a mask of the resist pattern 7c and the antireflection film pattern 5a by using a plasma of a mixed gas of $Cl_2$ and $O_2$ or a mixed gas of HBr and $O_2$, controlled in a pressure of 0.2 to 10 Pa by an ICP or ECR-type etching device to form a film pattern 3a. Thereafter, the resist pattern 7c, which has now been unnecessary, is removed, followed by processing via given steps, thereby completing a desired semiconductor device.

As stated hereinabove, according to the first embodiment of the invention, the antireflection film containing a basic substance and serving as an underlying layer, on which a chemically amplifying resist is to be formed, is exposed on the surface thereof to a plasma using a C-containing gas, so that upon exposure in the course of the formation of a chemically amplifying resist pattern, neutralization reaction which would otherwise occur at the interface between the antireflection film and the chemically amplifying resist is suppressed thereby obtaining a resist pattern having a good configuration Moreover, the adhesion between the chemically amplifying resist and the antireflection film is improved due to the plasma treatment, so that the separation of the resist can be appropriately prevented. As a result, the etching controllability of the film to be processed via the mask of the chemically amplifying resist pattern is improved, thus enabling one to manufacture a semiconductor device having a highly dimensional-accuracy-controlled, good pattern of the film to be processed.

Second Embodiment

Figure 4:
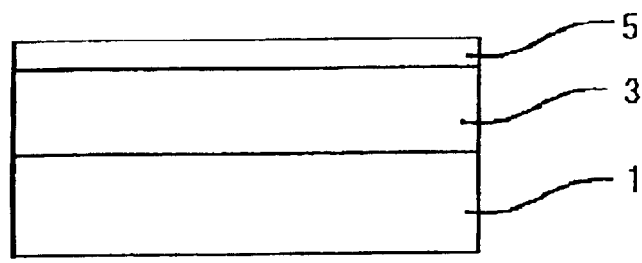
FIG. 4 is a schematic sectional view showing the manufacturing steps of a semiconductor device according to the second embodiment of the invention.
Figure 4:
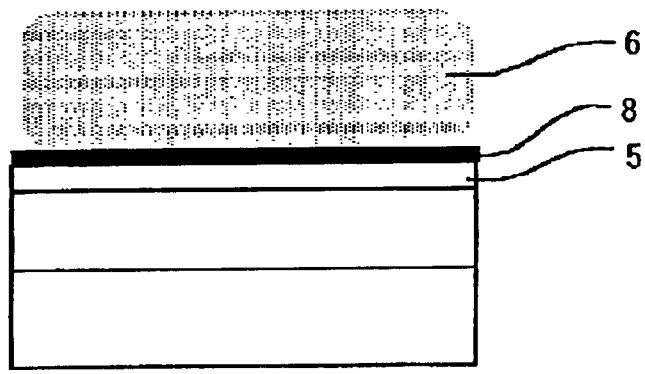
Figure 4:
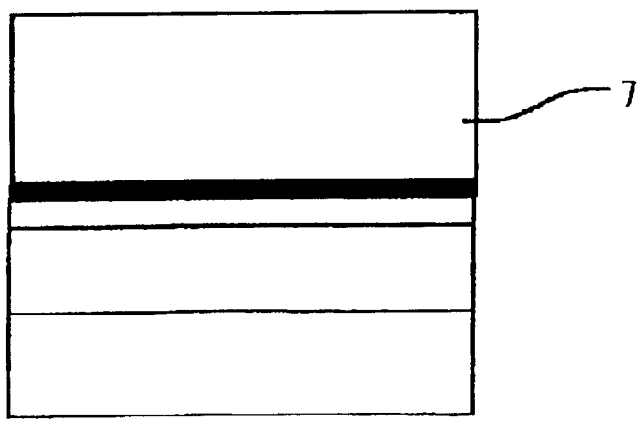
Figure 5:
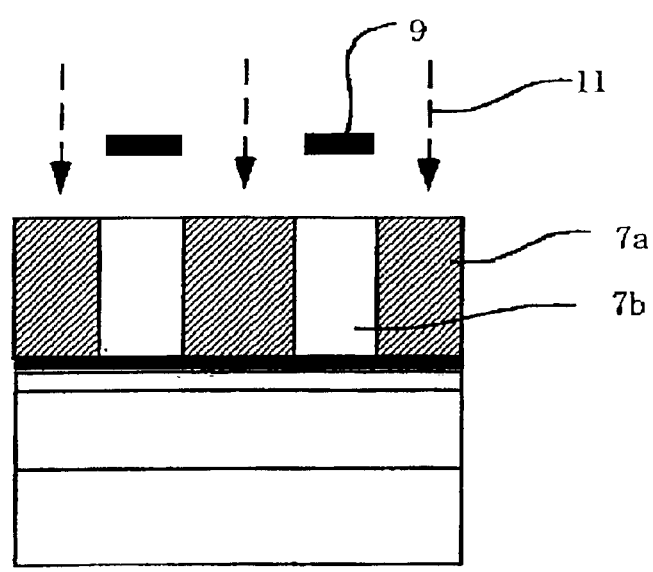
FIG. 5 is a schematic sectional view showing the manufacturing steps of a semiconductor device according to the second embodiment of the invention.
Figure 5:
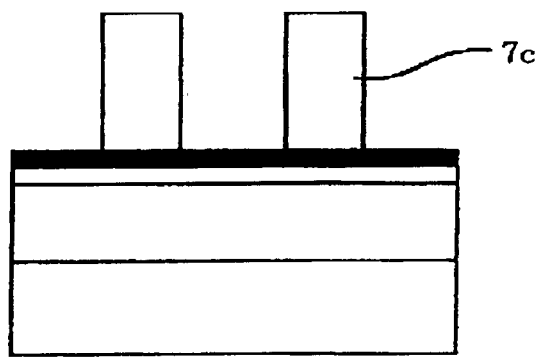
Figure 5:
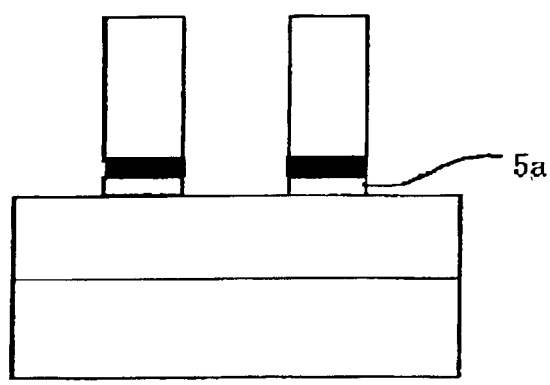
Figure 6:
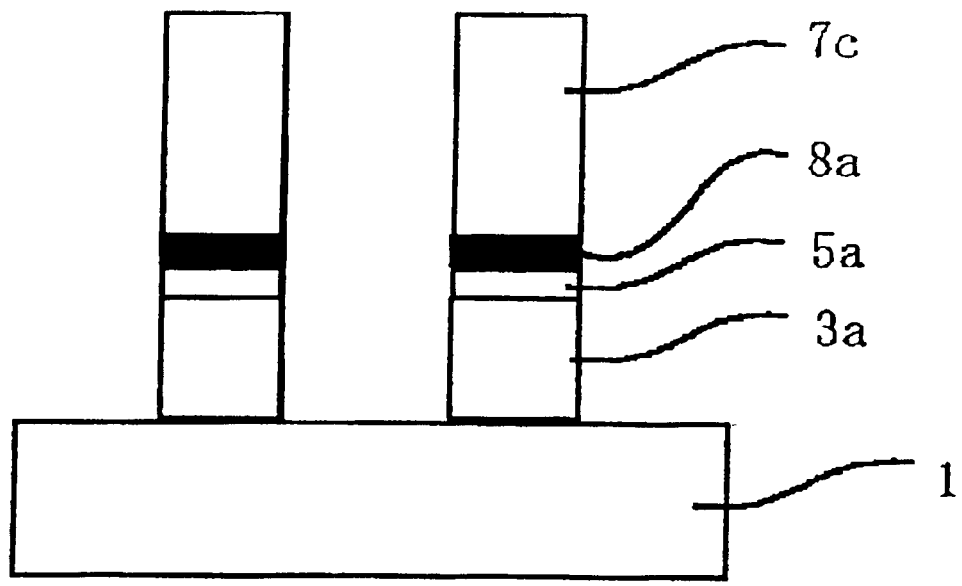
FIG. 6 is a schematic sectional view showing the manufacturing steps of a semiconductor device according to the second embodiment of the invention.

In the first embodiment, the underlying film containing a basic substance is subjected to a C-containing plasma treatment so as to modify the surface thereof. In this embodiment, a surface treatment method that would be more reduced in damage than the plasma treatment is dealt with. FIG. 4, FIG. 5, and FIG. 6 are, respectively, a schematic sectional view showing the step of manufacturing a semiconductor device according to the second embodiment of the invention. With reference to these figures, this embodiment is described in detail.

Referring to FIG. 4(a), like the first embodiment, a film 3 to be processed, which is made of polysilicon, and an antireflection film 5 as the underlying film, which contains a basic substance and is made of SiON or the like, are successively formed on a semiconductor substrate 1. Next, referring to FIG. 4(b), the surface of the antireflection film 5 on the semiconductor substrate 1 is exposed to an $O_3$ (ozone) gas 6 to modify the surface of the antireflection film 5.

The $O_3$ gas 6 is fed to the surface of the semiconductor substrate 1 by the force exhausting an ozone gas generated in an ozonator while mounting the semiconductor substrate 1 on a stage of a given treating apparatus set at a temperature of 20° C. to 200° C. and keeping a pressure inside the apparatus within 100 mTorr to 10 Torr. According to such a surface treatment as set forth above, a modified layer 8 made of a 1 nm to 10 nm thick oxide film ($SiO_x$ (wherein 0<x<2)) is formed on the antireflection film 5.

Next, reference is made to FIG. 4(c), in which a 500 nm thick positive type, chemically amplifying resist film 7 is formed on the antireflection film 5 forming the modified layer 8 on the surface thereof. Subsequently, with reference to FIG. 5(a), the semiconductor substrate 1 is irradiated with an excimer laser beam 11 such as KrF (248 nm) or ArF (193 nm) through a photomask 9 having a desired pattern, thereby exposing the chemically amplifying resist 7 to the beam.

Upon the exposure, although a proton acid ($H^+$) as a catalyst for promoting a chemical change is generated in exposed portions 7a of the resist, the modified layer 8 formed on the surface of the antireflection film 5 as an underlying film acts as a block layer for blocking the feed of electrons from the antireflection film 5, thereby holding neutralization reaction (acid deactivating phenomenon) at the interface between the resist and the antireflection film.

As a result, with reference to FIG. 5(b), the solubility of the exposed portions 7a in a liquid developer in a subsequent developing treatment increases, so that a resist pattern 7c formed by leaving the non-exposed portions 7b takes a trailed skirt-free, good configuration. Since the semiconductor substrate is only exposed to the atmosphere of a gas, such a charge-up damage caused by a plasma as experienced during a plasma treatment is reduced, so that the breakage of a gate insulating film or the like can be prevented.

Like the case of the first embodiment, with reference to FIG. 5(c), the modified layer 8 and the antireflection film 5 are subsequently etched through a mask of the resist pattern 7c to form an antireflection film pattern 5a. Thereafter, with reference to FIG. 6, the film 3 to be processed is etched through a mask of the resist pattern 7c and the antireflection film pattern 5a to form a pattern 3a of the film to be processed. Finally, the unnecessary resist pattern 7c is removed, followed by given steps to complete a semiconductor substrate.

As stated hereinabove, according to the second embodiment of the invention, the antireflection film containing a basic substance and serving as an underlying layer, on which the chemically amplifying resist is to be formed, is exposed to an $O_3$ gas on the surface thereof, so that upon exposure in the course of the formation of the chemically modified resist pattern, neutralization reaction which would occur at the interface between the antireflection film and the chemically amplifying resist is hold thereby obtaining a resist pattern having a good configuration. As a consequence, the etching controllability of the film to be processed through the mask of the resist pattern is improved, thereby ensuring the manufacture of a semiconductor device that has a highly dimensional-accuracy-controlled, good pattern configuration of the film to be processed.

Since the modified layer is formed only by exposure to an $O_3$ gas, such a charge-up damage caused by a plasma as experienced during a plasma treatment can be reduced, making it possible to manufacture a reliable semiconductor device.

Third Embodiment

In the second embodiment, the surface of the antireflection film, which is used for an underlying film of a chemically amplifying resist is modified with an ozone gas. In this embodiment, a high temperature gas containing oxygen such as $N_2O$ or $O_2$ is used in place of ozone gas. Other steps are similar to those of the second embodiment. Such a high temperature gas that is heated to a high temperature of 600° C. to 1000° C. in a reaction furnace is fed to the surface of a semiconductor substrate 1 by the force of exhaustion thereof while mounting the semiconductor substrate on a stage of a given apparatus and keeping pressure inside the apparatus within 100 mTorr to 10 Torr.

As stated hereinabove, according to the third embodiment of the invention, the basic substance-containing antireflection film serving as an underlying layer, on which a chemically amplifying resist is to be formed, is exposed to an oxygen-containing high temperature gas such as $N_2O$ or $O_2$ gas, with the result that neutralization reaction which would otherwise occur at the interface between the antireflection film and the chemically amplifying resist upon exposure in the course of the formation of the chemically amplifying resist pattern is suppressed, thereby obtaining a resist pattern having a good configuration. As a result, the etching controllability of the film to be processed via the resist pattern mask is improved, thus enabling the manufacture of a semiconductor device that has a highly dimensional-accuracy-controlled, good pattern of the film to be processed.

Further, the modified layer is formed only by exposure to $N_2O$ or $O_2$ gas, so that the charge-up damage caused by plasma as experienced in the plasma treatment can be reduced, thereby ensuring the manufacture of a reliable semiconductor device.

Fourth Embodiment

In the embodiments 1 to 3, the modified layer is formed on the surface of a basic substance-containing underlying film and the neutralization reaction is suppressed by blocking the feed of electrons from the underlying film toward the resist. In this embodiment, electric process is made on a semiconductor substrate to suppress the neutralization reaction of a proton acid (H$^+$) in the resist generated in the vicinity of the interface with the underlying film.

Figure 7:
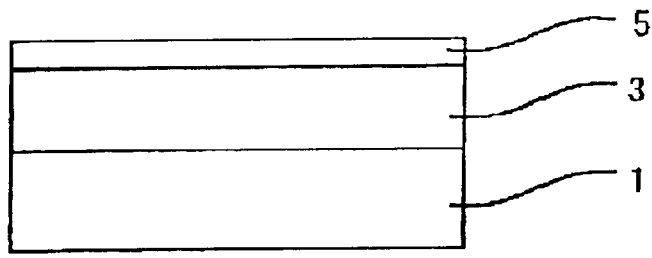
FIG. 7 is a schematic sectional view showing the manufacturing steps of a semiconductor device according to the third embodiment of the invention.
Figure 7:
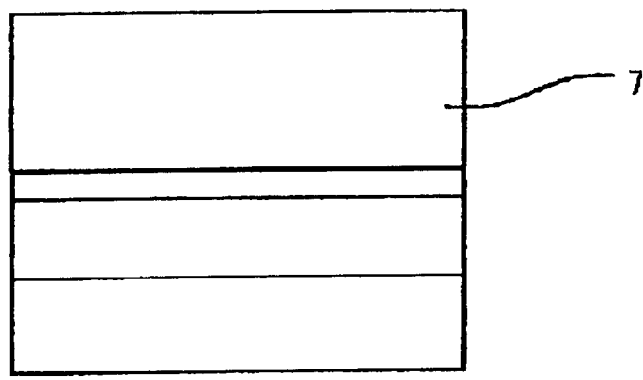
Figure 7:
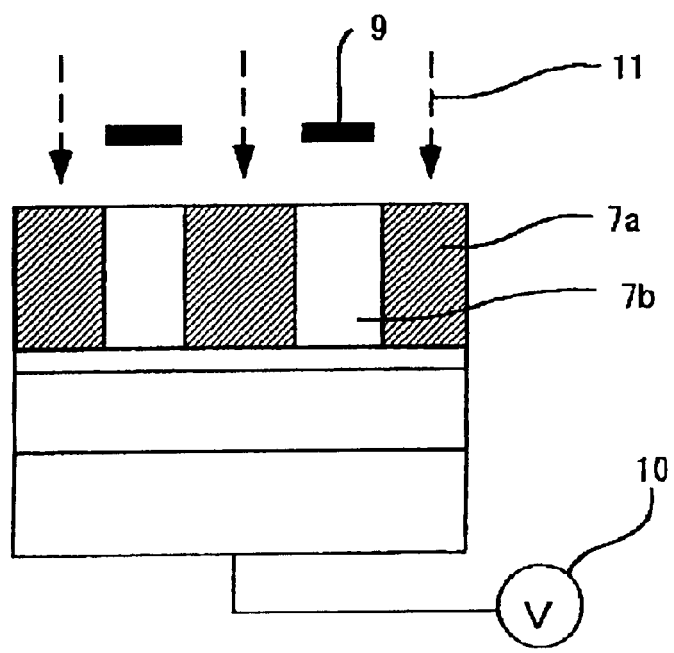
Figure 8:
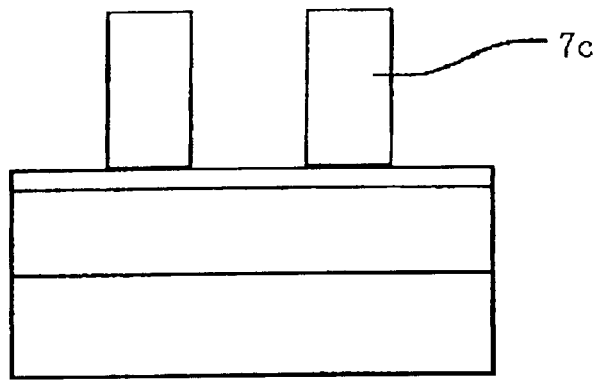
FIG. 8 is a schematic sectional view showing the manufacturing steps of a semiconductor device according to the third embodiment of the invention.
Figure 8:
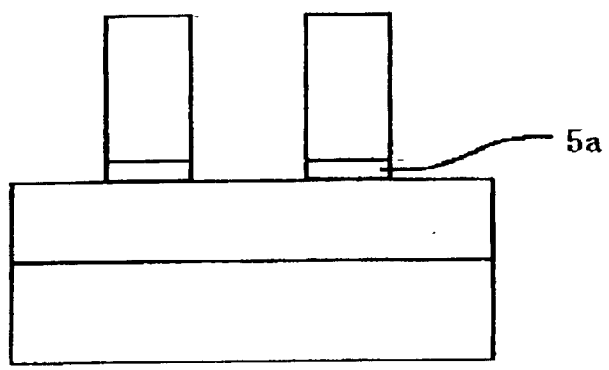
Figure 8:
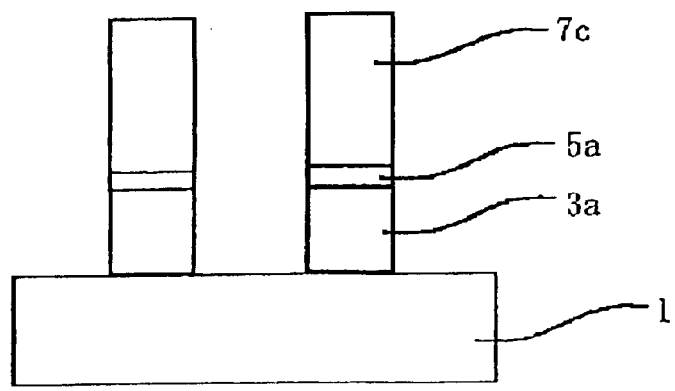

FIG. 7 and FIG. 8 are, respectively, a schematic sectional view showing the steps of manufacturing a semiconductor device according to the fourth embodiment of the invention. Referring now to FIG. 7(a), a film 3 to be processed, which is made of polysilicon, and a basic substance-containing antireflection film 5 as the underlying film such as of SiON are successively formed on a semiconductor substrate 1. Next, with reference to FIG. 7(b), a chemically amplifying resist film 7 is formed on the antireflection film 5.

Next, with reference to FIG. 7(c), the semiconductor substrate 1 is irradiated with an excimer laser beam 11 such as of KrF (248 nm) or ArF (193 nm) through a photomask 9 having a desired pattern to expose the chemically amplifying resist 7 to the beam. Upon the exposure, a given positive potential by a voltage application means 10 is applied to the semiconductor substrate 1. The potential may be applied directly to the semiconductor substrate 1, or may be applied indirectly by application of a voltage to a stage of a semiconductor manufacturing apparatus in which the semiconductor substrate is mounted.

Figure 9:
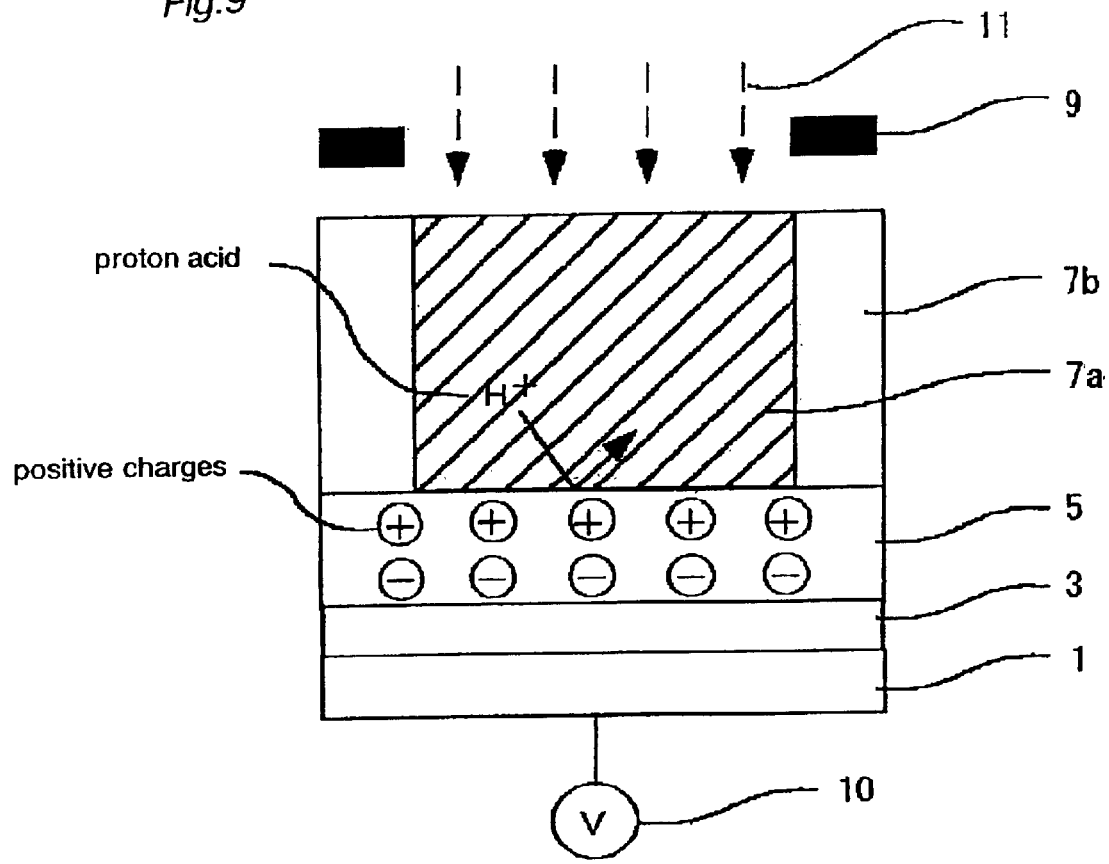
FIG. 9 is a schematic sectional view showing the manufacturing steps of a semiconductor device according to the third embodiment of the invention.
Figure 10:
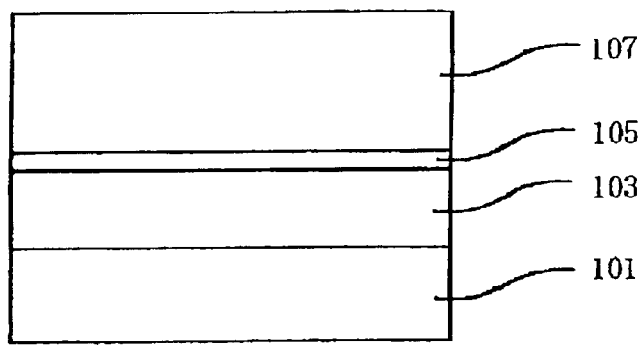
FIG. 10 is a schematic sectional view showing a conventional method of manufacturing a semiconductor device.
Figure 10:
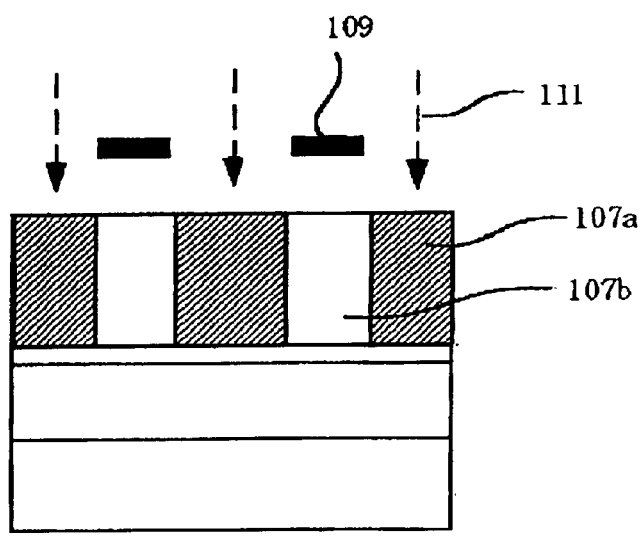
Figure 10:
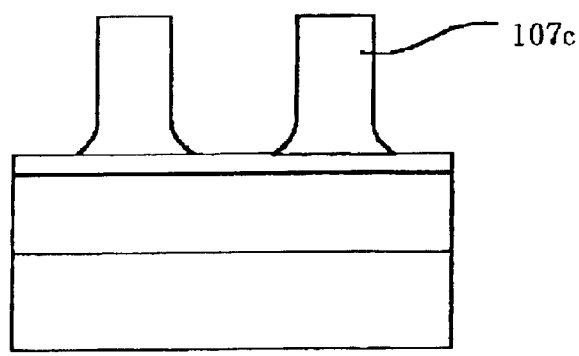
Figure 11:
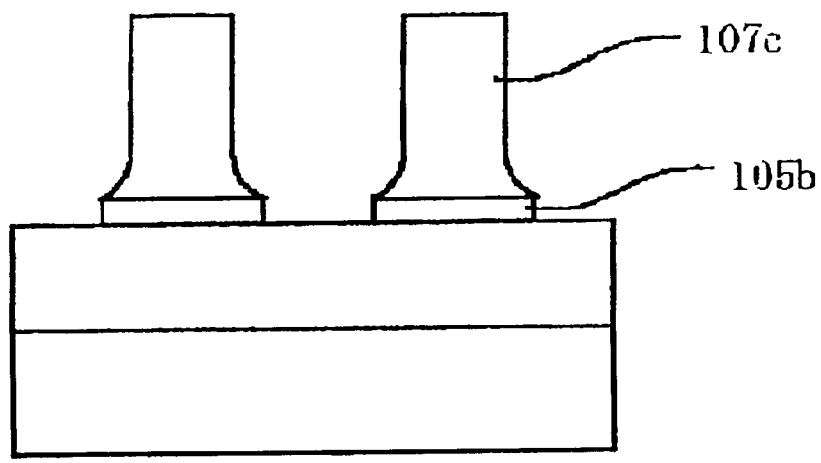
FIG. 11 is a schematic sectional view showing a conventional method of manufacturing a semiconductor device.
Figure 11:
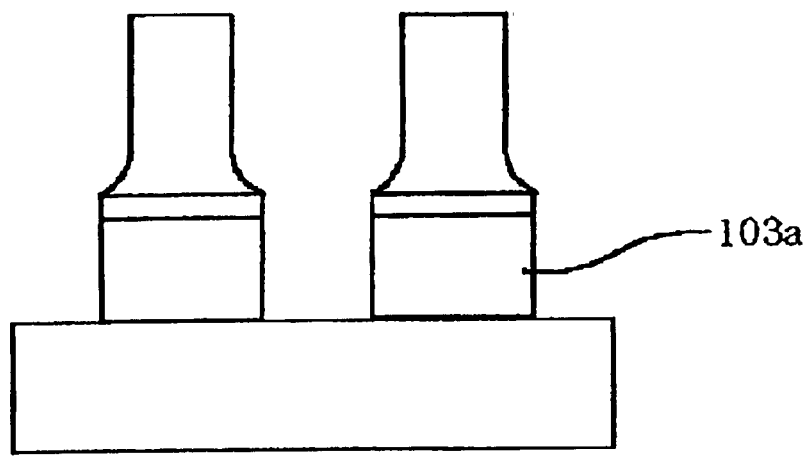
Figure 12:
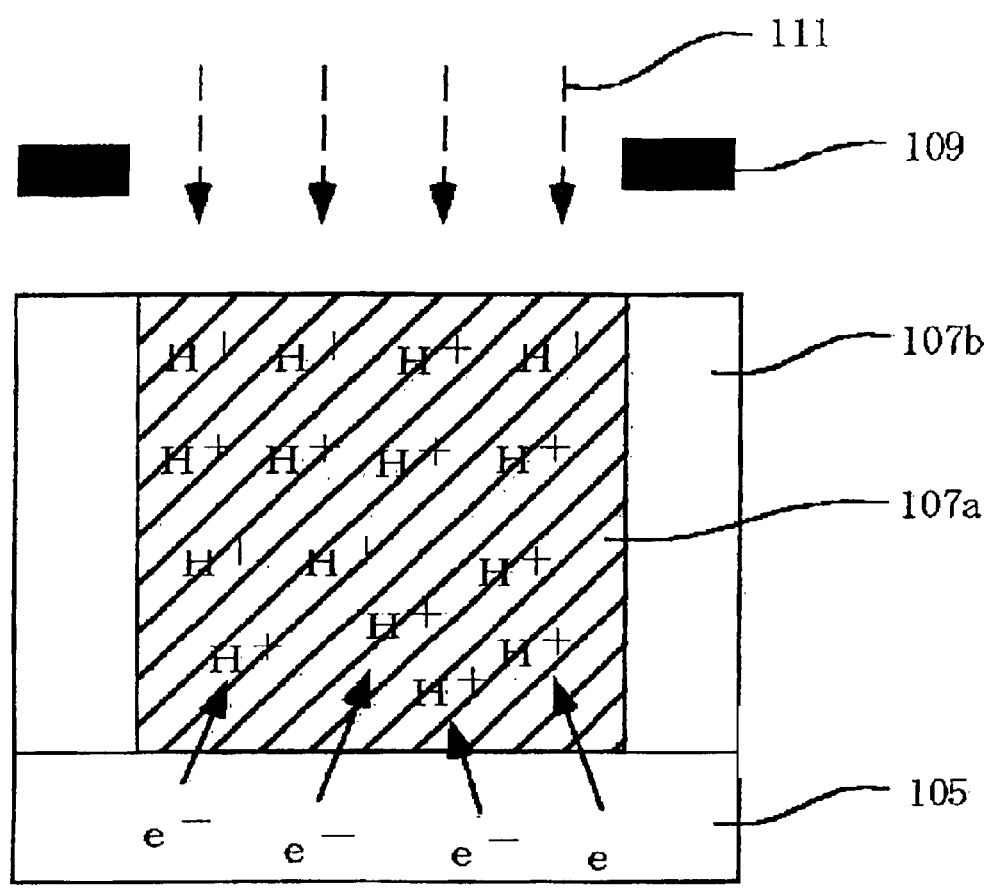
FIG. 12 is a schematic sectional view of a semiconductor device to explain conventional problems.

FIG. 9 is a sectional view of part of a semiconductor device schematically showing the behavior of electric charges in the antireflection film 5 in case where a positive potential is applied to the semiconductor substrate. Reference is made to FIG. 9, wherein when a positive potential is applied to the semiconductor substrate 1, charges in the antireflection film 5 are polarized into positive charges gathering at one surface and negative charges (electrons) at an opposite surface. In this condition, when the chemically amplifying resist 7 is exposed to, a proton acid (H$^+$) as a catalyst for promoting a chemical reaction is generated in the exposed portion 7a. On the other hand, the basic antireflection film 5 has electrons polarized in such a way as set out above and the electrons exist as if they are trapped, thus causing the basic nature of supplying electrons to be weakened.

As a result, the supply of electrons from the antireflection film 5 is reduced and the neutralization reaction between the proton acid (H$^+$) and the electrons in the resist is suppressed. As shown in FIG. 8(a), the solubility of the exposed portion 7a in a liquid developer increases in a subsequent developing treatment, thus leading to the fact that the resulting resist pattern 7c formed by leaving non-exposed portions 7b as they are takes a trailed skirt-free, good configuration.

Subsequent steps are carried out as in the first embodiment wherein referring to FIG. 8(b), the antireflection film 5 is etched through a mask of the resist pattern 7c to form an antireflection pattern 5a. Next, referring to FIG. 8(c), the film 3 to be processed is etched through a mask of the resist pattern 7c and the antireflection film pattern 5a to form a film pattern 3a. Thereafter, the unnecessary resist pattern 7c is removed, followed by given steps to complete a semiconductor device.

It is to be noted that if the positive potential given by the voltage application means 10 is too high, the proton acid (H$^+$) in the resist is repulsed with the positive charges gathering by polarization in the surface of the antireflection film. This causes the catalytic reaction at the bottom of the resist to be lowered, with the possibility that the configuration is worsened. Accordingly, the applied positive potential should be great enough to permit electrons to be trapped and should be at such a small level that the proton acid (H$^+$) is not repulsed, and is preferably within a range of +100 V to 1000V.

In the above instance, the applied voltage has been a positive DC voltage, and similar results are obtained when a high frequency voltage is applied so that the proton acid (H$^+$) moves toward the vicinity of the interface with the antireflection film while vertically vibrating in the exposed portions 7a of the resist. The high frequency should preferably be within a range of 100 kHz to 20 MHz which the H$^+$ions of the proton acid follow up.

According to the fourth embodiment of the invention, a positive potential is applied to the semiconductor device, under which electrons in the antireflection film are trapped and thus, the nature of supplying electrons of the antireflection film as a base is weakened. The deactivation of the proton acid (H$^+$) in the chemically amplifying resist is suppressed, thereby providing a resist pattern of a good configuration. As a consequence, the etching controllability of the film to be processed through the mask of the resist pattern is improved, thereby obtaining a semiconductor device having a highly dimensional-accuracy-controlled, good film pattern configuration of the film to be processed.

In the foregoing embodiments, although it is assumed that the underlying film exhibiting basicity consists of an antireflection film, limitation is not necessarily placed on this instance. The method of the invention may be applied to on any types of underlying films so far as such underlying films contain a basic substance and exhibit basicity. For instance, it is possible to apply the method of the invention to pattern formation on N-containing materials including not only TiN, WN (tungsten nitride) and TaN (tantalum nitride) used as a barrier metal film, but also BN (boron nitride), CN (carbon nitride), AlN (aluminium nitride), GaN (gallium nitride), GeN (germanium nitride) and the like which are used as a film for other purposes. Further, although it is assumed that the chemically amplifying resist is of the positive type, similar results are, of course, obtained when using a negative type of resist.

The invention is so arranged as set forth hereinabove and produces such effects as described below.

According to one aspect of the invention, the surface of a basic substance-containing underlying film is treated with a plasma of a carbon-containing gas, so that a chemically amplifying resist formed thereon can be accurately patterned.

According to another aspect of the invention, adhesion between the underlying film and the chemically amplifying resist is improved, so that the separation of the resist can be prevented.

According to another aspect of the invention, a resist pattern of high accuracy can be formed on an underlying film such as of SiON, SiN, TiN, WN, TaN, BN, CN, AlN, GaN or GeN.

According to another aspect of the invention, the reflection of an exposure beam can be prevented, so that a more accurate resist pattern can be formed.

According to another aspect of the invention, the surface of a basic substance-containing underlying film is exposed to an ozone gas, so that a chemically amplifying resist formed thereon can be accurately patterned and the damage on the underlying film can be reduced, thereby ensuring highly reliable patterning.

According to another aspect of the invention, a basic substance-containing underlying film is exposed to an oxygen-containing high temperature gas on the surface thereof, so that a chemically amplifying resist formed thereon can be accurately patterned and the damage on the underlying film can be reduced, thereby ensuring highly reliable patterning.

According to another aspect of the invention, the chemically amplifying resist can be accurately formed by using a simple gas, such as N$_2$O or O$_2$, as the high temperature gas.

According to another aspect of the invention, the basic substance-containing underlying film is polarized by application of a positive potential to a substrate, so that the chemically amplifying resist formed thereon can be accurately formed.

According to another aspect of the invention, the controllability of an applied voltage is improved, so that stable patterning of the chemical amplifying resist is possible.

According to another aspect of the invention, the patterning of the chemically amplifying resist in high accuracy can be realized by using an existing semiconductor manufacturing apparatus.

According to another aspect of the invention, the film to be process can be etched through an accurate resist pattern mask, so that the etching controllability of the film is improved, thereby obtaining a semiconductor device having a highly dimensional-accuracy-controlled, good film pattern configuration.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-007228, filed on Jan. 16, 2002 including specification, claims, drawings and summary, on which the Convention priority of the present application is based, are incorporated herein by reference in its entirety.

What is claimed is:

1. A method for forming a resist pattern, which comprises the steps of:

treating a surface of an underlying film containing a basic substance by exposure to a plasma using a carbon-containing gas;

forming a chemically amplifying resist on the surface-treated underlying film; and subjecting said chemically amplifying resist to exposure and development treatments thereby patterning said chemically amplifying resist.

2. A method for forming a resist pattern according to claim 1, wherein the carbon-containing gas is a gas containing at least one of a fluorocarbon, a hydrofluorocarbon, hydrocarbon, hexamethyldisilazane, CO, $CO_2$, and R—OH (an alcohol).

3. A method for forming a resist pattern according to claim 1, wherein said underlying film contains at least one of SiON, SiN, TIN, WN, TaN, BN, CN, AlN, GaN and GeN.

4. A method for forming a resist pattern according to claim 1, wherein said underlying film is an antireflection film.

5. A method for forming a resist pattern according to claim 1, wherein the surface treatment forms a modified layer on the surface of the underlying film containing the basic substance.

6. A method of forming a resist pattern according to claim 5, wherein the modified layer is a CF-based polymer.

7. A method for manufacturing a semiconductor device, which comprises the step of etching an underlying film by use of the resist pattern formed according to the method for forming a resist pattern recited in claim 1.

8. A method for manufacturing a semiconductor device, which comprises the step of etching an underlying film by use of the resist pattern formed according to the method for forming a resist pattern recited in claim 2.

9. A method for manufacturing a semiconductor device, which comprises the step of etching an underlying film by use of the resist pattern formed according to the method for forming a resist pattern recited in claim 3.

10. A method for manufacturing a semiconductor device, which comprises the step of etching an underlying film by use of the resist pattern formed according to the method for forming a resist pattern recited in claim 4.

* * * * *